United States Patent
Hamamoto

[11] Patent Number: 6,148,132
[45] Date of Patent: Nov. 14, 2000

[54] SEMICONDUCTOR OPTICAL AMPLIFIER

[75] Inventor: Kiichi Hamamoto, Tokyo, Japan

[73] Assignee: NEC Corporation, Tokyo, Japan

[21] Appl. No.: 09/132,342

[22] Filed: Aug. 12, 1998

[30] Foreign Application Priority Data

Aug. 18, 1997 [JP] Japan .................................. 9-221420

[51] Int. Cl.$^7$ ...................................................... G02B 6/10
[52] U.S. Cl. ........................................................ 385/131
[58] Field of Search ................. 372/6, 45; 385/131–135, 385/147

[56] References Cited

U.S. PATENT DOCUMENTS

| | | | |
|---|---|---|---|
| 4,689,797 | 8/1987 | Olshansky ................................ | 372/45 |
| 4,939,474 | 7/1990 | Eisenstein et al. ....................... | 330/4.3 |
| 5,436,759 | 7/1995 | Dijaili et al. ............................. | 359/333 |

FOREIGN PATENT DOCUMENTS

| | | | |
|---|---|---|---|
| 13084 WO 96 | 5/1996 | Germany ............................... | 385/131 |
| 13084A | 5/1996 | Germany . | |
| 64-33986 | 2/1989 | Japan . | |
| 2-78291 | 3/1990 | Japan . | |
| 4-179179 | 6/1992 | Japan . | |
| 5-67845 | 3/1993 | Japan . | |
| 6-235833 | 8/1994 | Japan . | |
| 7-244303 | 9/1995 | Japan . | |
| 9-288287 | 11/1997 | Japan . | |
| 10-073736A | 3/1998 | Japan . | |
| WO 96 09668A | 3/1996 | WIPO . | |

OTHER PUBLICATIONS

L.B. Solando, et al., "Optical Multi–Mode Interference Devices Based on Self–Imaging: Principles and Applications", *Journal of Lightwave Technology*, vol. 13, NO. 4, Apr. 1995 pp. 615–627.

*Primary Examiner*—Akm E. Ullah
*Attorney, Agent, or Firm*—Scully, Scott, Murphy & Presser

[57] ABSTRACT

A semiconductor optical amplifier wherein poalization independent gain, high saturation input light intensity, and high saturation gain are obtained. The semiconductor optical amplifier of the present invention comprises a 1×1 multi mode interference (MMI) light waveguide region and a couple of single mode waveguide regions, each of which is connected with each end of the multi mode region. The length of the multi mode waveguide region is about 340 μm and the length of the single mode waveguide regions is about 20 μm. The width of the multi mode waveguide region is about 12 μm while the widths of the single mode waveguide regions 2,3 are about 1 μm.

7 Claims, 4 Drawing Sheets

SEMICONDUCTOR OPTICAL AMPLIFIER

BACKGROUND OF THE INVENTION

1. Field of the Invention

The present invention relates to a polarization independent semiconductor optical amplifier with high saturation input and high saturation gain.

2. Prior Art

Recently, the optical communication technology has been progressing as one of the technologies for a large capacity and high speed transmission. Amongst various optical communication technologies, a switching function of the semiconductor optical amplifiers as well as an amplifier function is of great interest, because the optical amplifier absorbs light without injection current.

Preferably, the optical amplifier is expected to amplify signal light which passes through an optical fiber without controlling the polarization. Accordingly, the polarization independent gain is desirable.

Therefore, various methods for implementing the polarization independent gain have been proposed. An example of the polarization independent semiconductor optical amplifier is reported in IEEE PHOTONICS TECHNOLOGY LETTERS(VOL.6, NO.2, FEBRUARY 1994, p170 to p172: P. Doussiere ). The polarization independent amplifier described in the above-mentioned document is compatible with the single mode output of light. Polarization independence is achieved by preparing a nearly square shaped active layer constructed by a bulk crystal, while the single mode condition is satisfied by narrowing the active layer to the grade of 0.5 $\mu$m.

In the above-mentioned reference, the waveguide is fabricated as narrow as about 0.5 $\mu$m in order to achieve both the polarization independent gain and the single mode wave output. However, it is not easy to fabricate accurately such an extremely narrow waveguide on a semiconductor substrate, with good reproduction and mass production yield.

SUMMARY OF THE INVENTION

Therefore, an object of the present invention is to provide a polarization independent semiconductor optical amplifier wherein the saturation input light intensity level and the saturation gain are improved.

A semiconductor optical amplifier of the present invention, which emits single mode light, comprises a light waveguide structure including a multi mode waveguide region.

The multi mode waveguide region is a 1×1 multi mode interference light waveguide.

Further, the above-mentioned light waveguide structure comprises the above-mentioned multi mode waveguide region and a couple of single mode waveguide regions, each of which is connected with each end of the multi mode waveguide region. Moreover, the multi mode waveguide is wider than the single mode waveguide.

As described above, the semiconductor optical amplifier of the present invention attains the polarization independent gain by using wide 1×1 MMI waveguide. Accordingly, the semiconductor optical amplifier of the present invention is easily fabricated with high reproductivity and high yield. Furthermore, the saturation incident light intensity and the saturation gain are increased, because the light is mainly amplified in a wide multi mode waveguide.

PREFERRED EMBODIMENT OF THE INVENTION

Figure 1:
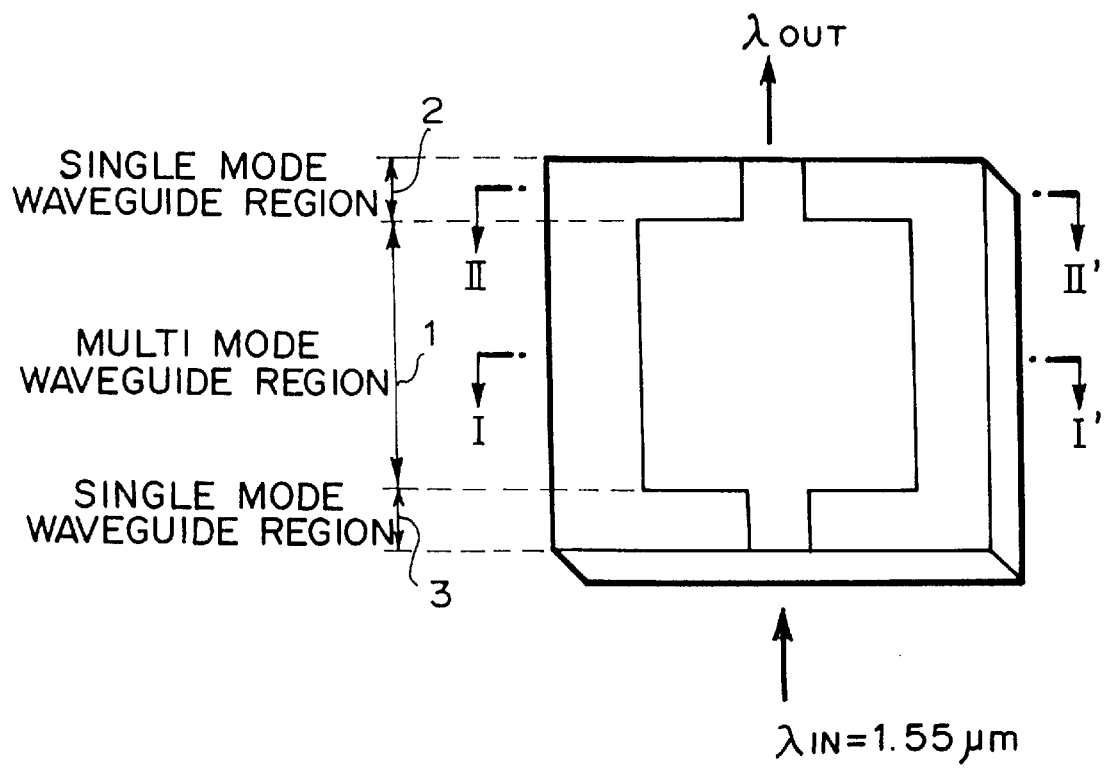
FIG. 1 is a perspective illustration of the semiconductor optical amplifier of the present invention.

Referring to the drawings, the embodiment of the present invention is explained in detail.

Figure 2A:
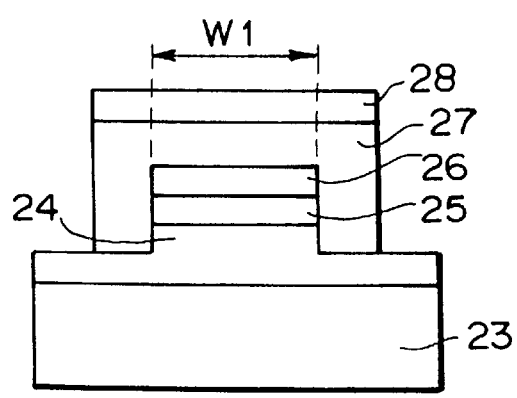
FIG. 2A is a cross sectional view taken on line I–I' of the semiconductor optical amplifier of the present invention as shown in FIG. 1.
Figure 2B:
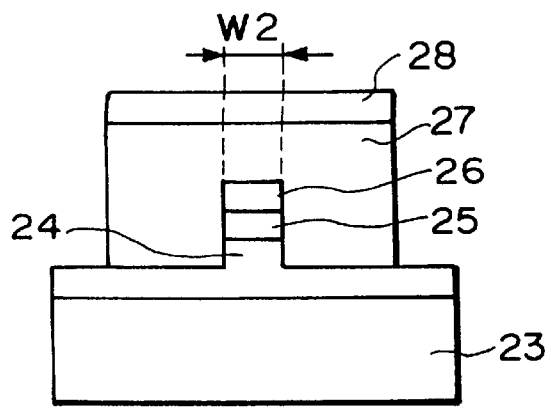
FIG. 2B is a cross sectional view taken on line II - II of the semiconductor optical amplifier of the present invention as shown in FIG. 1.

FIG. 1 is a perspective illustration of a 1.55 $\mu$m band semiconductor optical amplifier of the present invention. The semiconductor optical amplifier comprises multi mode waveguide region 1, and single mode waveguide regions 2 and 3 each of which is connected with each end of the multi mode region 1. The length of the multi mode waveguide region 1 is about 340 $\mu$m and the length of the single mode waveguide regions 2 and 3 is about 20 $\mu$m. Accordingly, the length of the whole device is about 380 $\mu$m. Multi mode waveguide region 1 is designed as a 1×1 multi mode interference (MMI) light waveguide. FIG. 2A is a cross sectional view taken on line I–I' to show the layered structure of the multi mode waveguide region, and FIG. 2B is a cross sectional view taken on line II–II' to show the layer structure of the single mode waveguide region. Both layer structures are the same except the widths of the waveguides. The width W1 of multi mode waveguide region 1 is 12 $\mu$m and those of single mode waveguide regions 2 and 3 are 1 $\mu$m.

Figure 3:
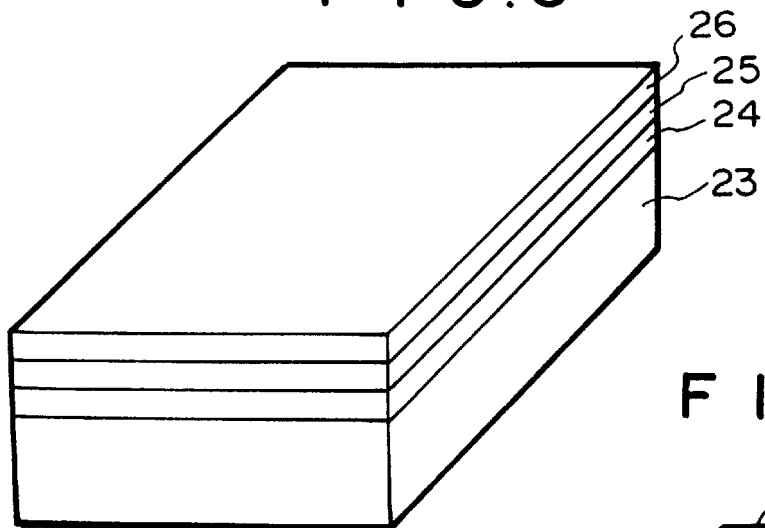
FIG. 3 is an illustration for explaining the first step of the manufacturing of the semiconductor optical amplifier of the present invention as shown in FIG. 1.
Figure 4:
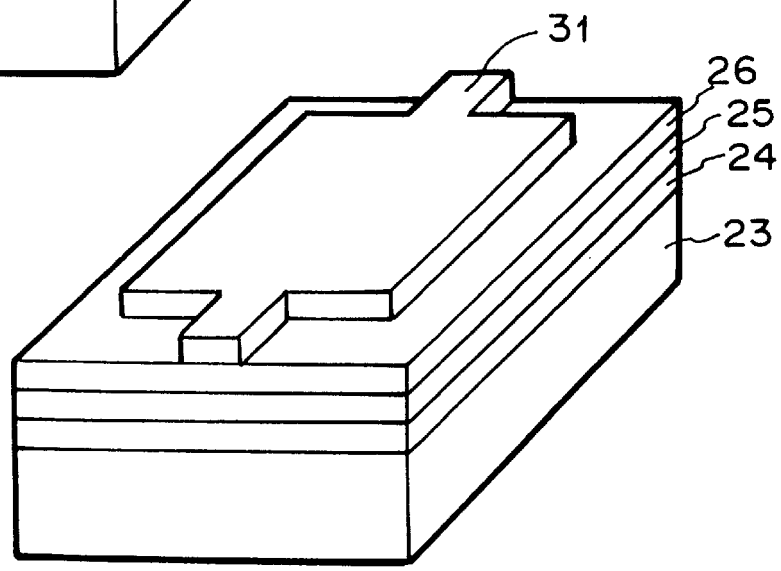
FIG. 4 is an illustration for explaining the second step of the manufacturing of the semiconductor optical amplifier of the present invention as shown in FIG. 1.
Figure 5:
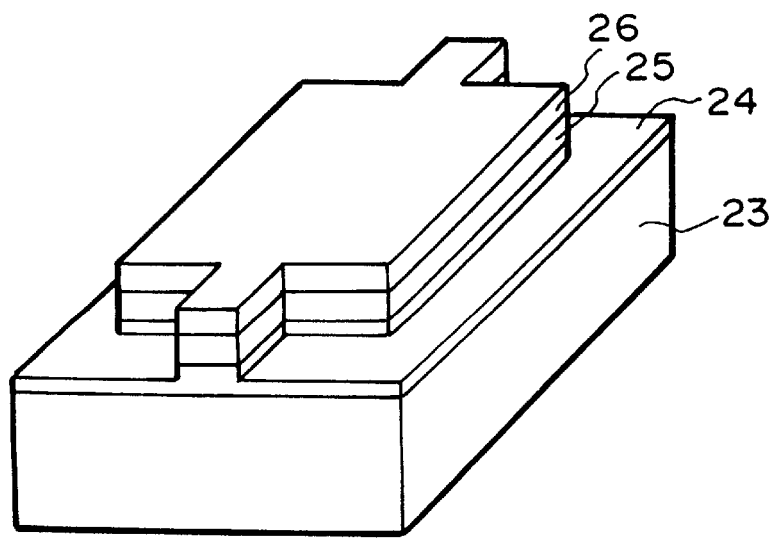
FIG. 5 is an illustration for explaining the third step of the manufacturing of the semiconductor optical amplifier of the present invention as shown in FIG. 1.

Next, referring to FIG. 3 to FIG. 7, the fabrication method of the semiconductor optical amplifier of the present invention is explained. As shown in FIG. 3, n-InP buffer layer 24 (about 200 nm thickness), 1.55 $\mu$m composition InGaAsP layer 25 (about 300 nm thickness), and p-InP cladding layer 26 (about 200 nm thickness) are grown sequentially by using metal organic vapor phase epitaxy (MOVPE) on n-InP substrate 23. Then, mask 31 for etching is formed on p-InP cladding layer 26 by using the conventional photolithography. Then, the unmasked part of p-InP cladding region 26, 1.55 μm composition InGaAsP layer 25, and n-InP buffer layer 24 are etched by using the reactive ion etching (RIE), as shown in FIG. 5.

Figure 6:
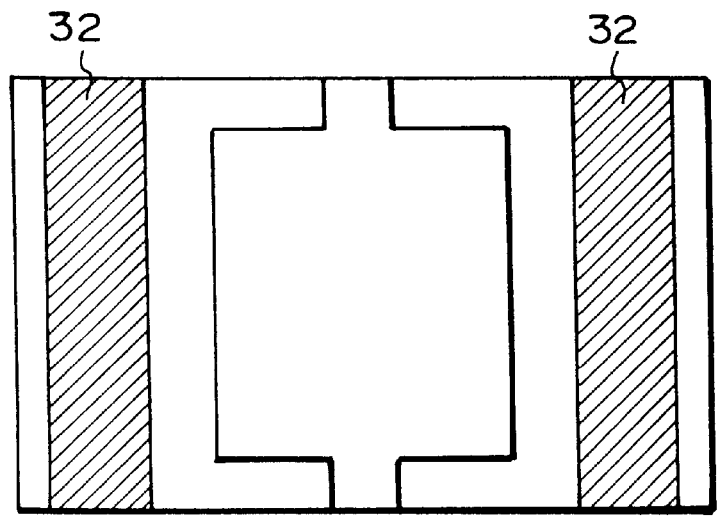
FIG. 6 is an illustration for explaining the forth step of the manufacturing of the semiconductor optical amplifier of the present invention as shown in FIG. 1.
Figure 7:
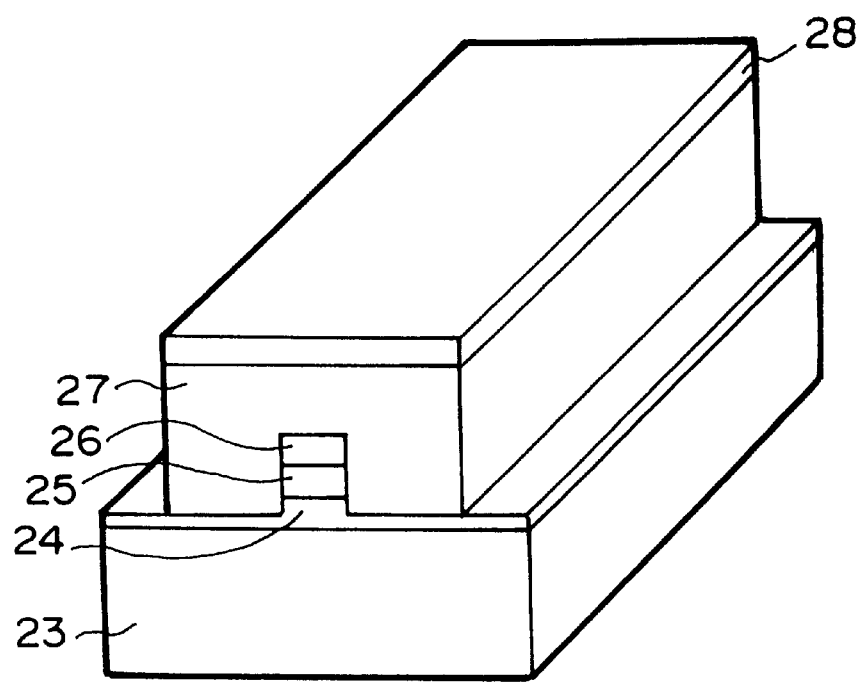
FIG. 7 is an illustration for explaining the fifth step of the manufacturing of the semiconductor optical amplifier of the present invention as shown in FIG. 1.

Next, after depositing $SiO_2$ on the whole surface by using the conventional thermal chemical vapor deposition (CVD), the $SiO_2$ is etched to form mask 32 for depositing a burying layer which surrounds mesa stripe by selective epitaxy, as shown in FIG. 6. Then, as shown in FIG. 7, p-InP burying layer 27 (about 2 μm thickness) and p-InGaAs capping layer 28 (about 200 μm thickness) are grown by using MOVPE.

Then, the backside of the device is polished, the substrate electrode and the surface electrode are metalized by using the conventional sputtering, and finally the anti-reflection coating layer is deposited on the cleaved facets of the mesa stripe.

The semiconductor optical amplifier of the present invention comprises multi mode waveguide region 1, as shown in FIG. 1. The multi mode waveguide region 1 is designed to act as a 1×1 MMI light waveguide wherein a single mode light output is obtained, although the main region where light is amplified is a waveguide with extremely wide waveguide as wide as about 12 μm.

According to the conventional theory, an extremely narrow waveguide with about 0.5 μm width along the whole waveguide is required to obtain a single mode light output. Also, according to the conventional theory, the thickness of the waveguide is increased to obtain polarization independent gain, so that the TM mode gain is increased to a level of the TE mode gain. However, the waveguide of which width is greater than 1 μm can barely emit single mode light, because the waveguide confines light strongly with the increase in its thickness. Thus, the polarization independence is made compatible with the single mode output.

On the contrary, a single mode light output is obtained without narrowing extremely the width of the waveguide by using the semiconductor optical amplifier of the present invention, because the main amplifying region is a 1×1 MMI light waveguide wherein the waveguide is 24 times wider than the above-mentioned conventional waveguide. Furthermore, the polariztion independent gain is implemented by designing the thickness of the waveguide such that TM mode gain is equal to the TE mode.

Figure 8A:
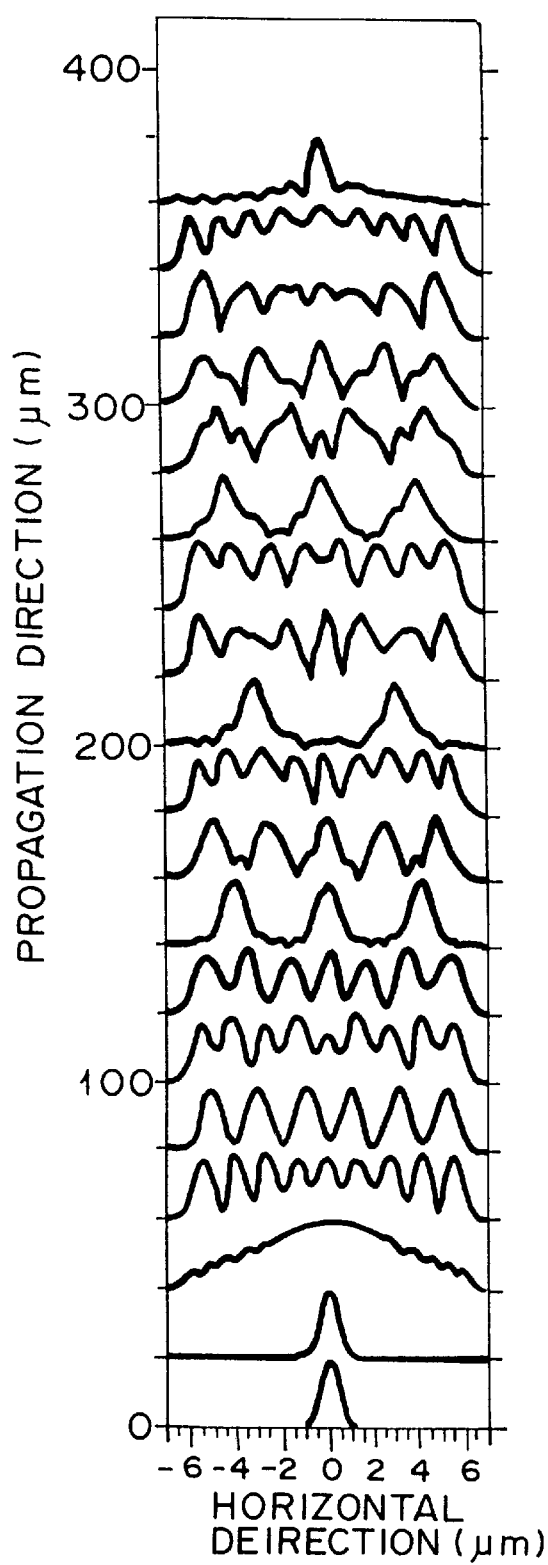
FIG. 8A is an illustration for explaining the simulation result for the TE mode of the action of the semiconductor optical amplifier of the present invention as shown in FIG. 1, by using the beam propagation method (BPM)
Figure 8B:
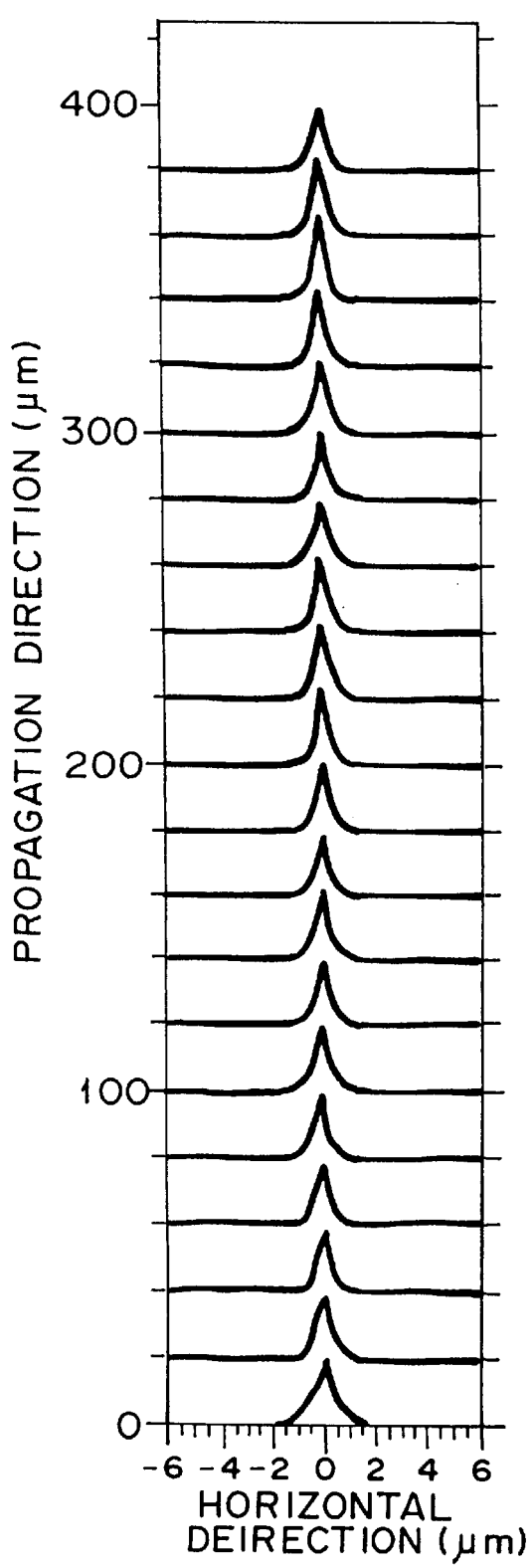
FIG. 8B is an illustration for explaining the simulation result for the TM mode of the action of the semiconductor optical amplifier of the present invention as shown in FIG. 1, by using the beam propagation method (BPM)

FIG. 8 shows a simulated result by using two dimensional beam propagation method (BPM) in the 1×1 MMI light waveguide with the same layered structure as the present invention which has a certain gain. The result fot the TE mode is shown in FIG. 8A and the result for the TM mode is shown in FIG. 8B. FIGS. 8A and 8B indicate that the semiconductor optical amplifier of the present invention behaves as a 1×1 MMI light waveguide and that a single mode optical output is obtained for both the TE mode and the TM mode. Furthermore, the difference of the gain depending upon the polarization direction is smaller than 0.3 dB, according to the simulated result. Thus, the polarization independent gain is obtained.

As explained above, the semiconductor optical amplifier of the present invention achievs the polarization independent gain by using, as the main amplifying region, a relatively wide waveguide which is fabricated easily with high reproductivity and high yield. Further, the saturation injection curent can be increased, because the waveguide is as wide as 12 μm. Accordingly, the saturation gain can be obtained and the saturation incident light intensity can be increased.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

For example, the present invention is applicable for the other layer structure instead of the burying structure of the present invention. The wavelength may well be 1.3 μm or in the near infrared or visible region, without limiting it to 1.55 μm.

The method of epitaxy may be MBE, instead of MOVPE and the method of forming the mesa may be wet etching, instead of RIE.

What is claimed is:

1. A polarization independent semiconductor optical amplifier wherein single mode light is outputted comprising;
   a light waveguide structure comprising,
      a multi mode interference waveguide region having a first and second end,
      a first single mode waveguide region connected to said first end of said multi mode interference waveguide region; and
      a second single mode waveguide region connected to said second end of said multi mode interference waveguide region.

2. The semiconductor optical amplifier according to claim 1, wherein said multi mode waveguide region is a 1×1 multi mode interference light waveguide which amplifies said single mode light.

3. The polarization independent semiconductor optical amplifier according to claim 2, wherein each end of said 1×1 multi mode interference light waveguide which amplifies said single mode light is connected with a single mode waveguide region.

4. The polarization independent semiconductor optical amplifier according to claim 1, wherein the width of said multi mode interference waveguide region is wider than the width of said first single mode waveguide region and said second single mode waveguide region.

5. The polarization independent semiconductor optical amplifier according to claim 3, wherein the width of said 1×1 multi mode interference light waveguide which amplifies said single mode light is wider than the width of said first single mode waveguide region and said second single mode waveguide region.

6. The polarization independent semiconductor optical amplifier according to claim 1, wherein a gain for TM mode of said multi mode interference waveguide is equal to a gain for TE mode.

7. The polarization independent semiconductor optical amplifier according to claim 1, wherein the thickness of said multi mode waveguide is such a thickness that a gain for TM mode is equal to a gain for TE mode.

* * * * *